(12) United States Patent
Eshraghi et al.

(10) Patent No.: US 6,316,809 B1
(45) Date of Patent: *Nov. 13, 2001

(54) ANALOG MOSFET DEVICES

(75) Inventors: Ali Eshraghi, Chatham; Venugopal Gopinathan, Basking Ridge; John Michael Khoury, New Providence; Maurice J. Tarsia, Colonia; Thi-Hong-Ha Vuong, Berkeley Heights, all of NJ (US)

(73) Assignee: Lucent Technologies Inc., NJ (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 1 days.

(21) Appl. No.: 09/226,378

(22) Filed: Jan. 6, 1999

(51) Int. Cl.$^7$ ................................................. H01L 29/772
(52) U.S. Cl. ........................... 257/344; 257/408; 438/305
(58) Field of Search .................... 257/344, 408; 438/305

(56) References Cited

U.S. PATENT DOCUMENTS

| | | | |
|---|---|---|---|
| 5,488,249 | * | 1/1996 | Crafts . |
| 5,512,499 | * | 4/1996 | Cambou et al. . |
| 5,532,508 | * | 7/1996 | Kaneko et al. . |
| 5,541,548 | * | 7/1996 | Crafts . |
| 5,811,341 | * | 9/1998 | Davies et al. . |
| 5,903,029 | * | 5/1999 | Hayashida et al. . |
| 5,920,104 | * | 7/1999 | Nayak et al. . |
| 6,078,082 | * | 6/2000 | Bulucea . |
| 6,078,086 | * | 6/2000 | Park . |
| 6,087,690 | * | 7/2000 | Chi . |
| 6,127,700 | * | 10/2000 | Bulucea . |

* cited by examiner

Primary Examiner—George Fourson
Assistant Examiner—Joannie Adelle Garcia

(57) ABSTRACT

The specification describes MOS transistors for analog functions which have increased output impedance. The increased output impedance is the result of reduced drain depletion width. This is accomplished without adverse effects on other device parameters. The MOS transistor structures have an implant added to the lightly doped drain (LDD) with a conductivity type opposite to that of the LDD and a doping level higher than the channel doping. The added implant confines the spread of the depletion layer and reduces its width. A relatively small confinement results in a significant increase in output impedance of the device, and a corresponding increase in transistor gain.

6 Claims, 5 Drawing Sheets

ANALOG MOSFET DEVICES

FIELD OF THE INVENTION

This invention relates to analog circuits using MOS field effect transistors (MOSFETs).

BACKGROUND OF THE INVENTION

Due to the predominance of digital circuits in integrated circuit technology most design efforts focus on optimizing digital circuit characteristics. Although a wide variety of applications exist for analog circuits, efforts to improve analog circuit performance are usually secondary to those devoted to digital circuits. In digital IC design, a major concern is threshold voltage, to ensure that all devices turn on or off at the same signal level. On-current and off-current are also important parameters in digital IC applications. For analog device performance, gain (gm) and bandwidth are the parameters of interest.

As IC technology advances, and IC devices shrink in size, some IC performance characteristics are affected positively and some negatively. For example, assuming a square law analog device, $g_m$ is proportional to the square root of the drain current for a given W/L ratio. Therefore, as devices are scaled down, capacitance C increases and $g_m$ increases (for a fixed W/L ratio and bias current) and circuits with higher speed are achievable. However, the output impedance $r_{out}$ decreases linearly with L as the device is shrunk. Consequently, as the technology advances and devices are scaled down it would be desirable to have a method for improving $r_{out}$ in order to maximize analog device performance.

SUMMARY OF THE INVENTION

We have recognized that an important parameter affecting the gain of an analog MOS transistor is the depletion width at the drain of the device. We have designed an MOS transistor structure which has reduced drain depletion width without adverse effects on other device parameters. This structure has an implant added to the lightly doped drain (LDD) with a conductivity type opposite to that of the LDD and a doping level higher than the channel doping. This added implant confines the spread of the depletion layer and reduces its width. A relatively small confinement results in a significant increase in output impedance of the device, and a corresponding increase in transistor gain.

Double implanted LDD devices have been used in short channel digital ICs to reduce $I_{off}$ at $V_{ds}=V_{dd}$, but not in analog devices where $V_{ds}$ is much lower than $V_{dd}$. Short channel is defined in this context as less than twice the minimum design rule for the technology used. The primary objective of a double implanted LDD in short channel digital devices is to control the threshold voltage, $V_T$, within specified limits. Thus the use of double implanted LDDs in digital devices is directed at adjusting $V_T$ by a significant amount, e.g., greater than 50 mV, and typically greater than 100 mV. However, the effect of this adjustment in a transistor performing an analog function is undesirable. The double implanted LDD of this invention improves output impedance in devices performing analog functions without significantly affecting the threshold voltage. It also improves output impedance in relatively long channel transistors, i.e. where channel length is greater than twice the minimum design rule. For example, in 0.25 µm technology, relatively long channel transistors may have channel lengths greater than 0.5 µm. In these devices short channel effects are not an issue, and double diffused LDDs of the prior are inapplicable.

DETAILED DESCRIPTION

Figure 1:
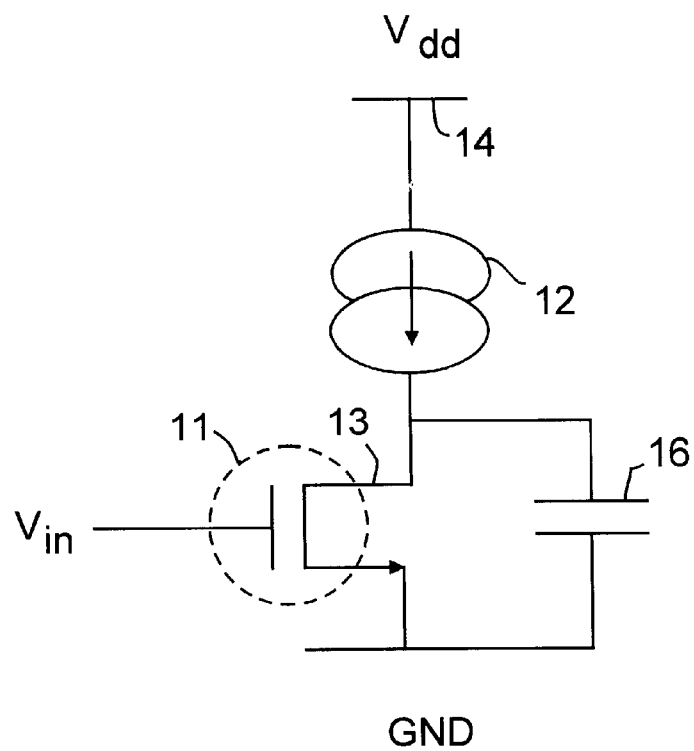
FIG. 1 is a circuit diagram showing the equivalent circuit of a typical MOS transistor gain stage.

In digital MOS device design, the parameter typically optimized is $I_{on}$ (at $V_{ds}=V_{gs}=V_{dd}$), while keeping $I_{off}$ (at $V_{ds}=V_{dd}$, and $V_{gs}=0$) at an acceptable limit, e.g. 1 pA/µm. In contrast, in analog applications the devices are not biased at $V_{ds}=V_{dd}$. A common practice is to choose a $V_{gs}-V_T$ of a few hundred mV, and a $V_{ds}=(V_{gs}-V_T)+500$ mV to assure that the transistor operates in the saturation region. Therefore, the design focus is on those parameters that characterize analog performance, namely device gain and bandwidth. FIG. 1 shows a typical MOS transistor gain stage, consisting of an NMOSFET 11 biased with a current source 12 between the drain terminal 13 and the power supply 14. The input voltage $V_{in}$ applied to the gate consists of an AC signal superimposed on a DC voltage. The capacitance (C) 16 between the output node and small signal ground represent the total load that this stage has to drive.

Figure 2:
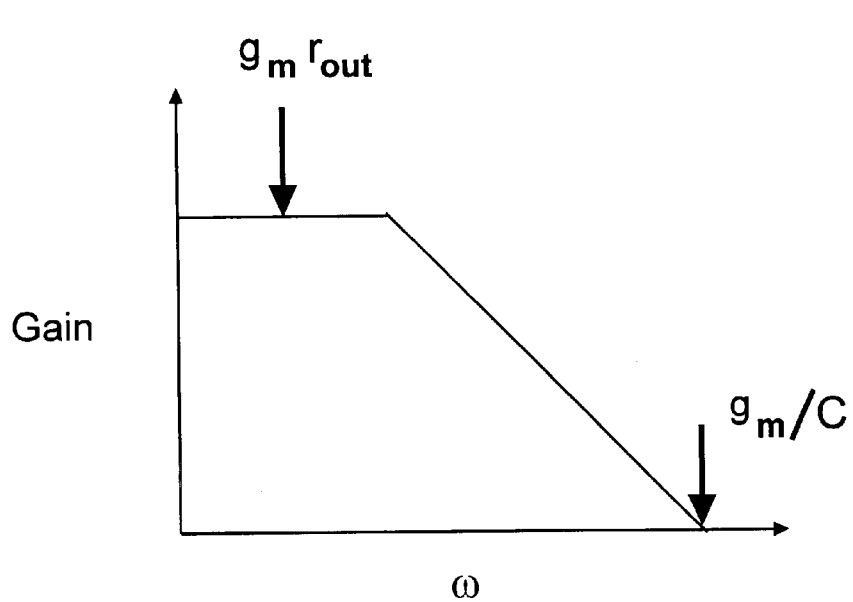
FIG. 2 is a plot of gain vs. frequency for the circuit of FIG. 1.

FIG. 2 shows a typical frequency response of the circuit of FIG. 1. The two important parameters in this circuit are gain and bandwidth. The gain of the block is given by $g_m r_{out}$, while the bandwidth is given by $g_m/C$. Assuming a square law device, $g_m$ is proportional to the square root of the drain current for a given W/L ratio. Therefore, as devices are scaled down, C decreases and $g_m$ increases (for a fixed W/L ratio and bias current). However, $r_{out}$ decreases linearly with L as the device is shrunk.

The drain current, $I_D$, of the device is represented by:

$$I_D = \frac{\mu_n}{2} C_{ox} \frac{W}{L} (V_{gs} - V_t)^\alpha (1 + \lambda V_{ds})$$

In this equation, λ is a parameter that determines the slope of the output characteristics and is inversely proportional to L. For square law devices α is equal to 2, but for submicron devices this parameter varies between 1 and 2. Therefore, under simplifying assumptions, voltage gain of the block can be expressed as:

$$gain \equiv g_m r_{out} \cong \frac{\alpha L}{(V_{gs} - V_t)} \frac{dV_{ds}}{dX_d}$$

where $X_D$ is the depletion width at the drain end and L is the effective channel length. This equation indicates that gain increases linearly with L. However, for a fixed channel length, gain is inversely proportional to $X_D$.

There are various ways to reduce the depletion width at the drain end. One method is to increase the threshold adjust implant dose. This increases the resistivity of the channel and reduces the size of the depletion region. However, it also causes the threshold voltage to increase, resulting in a reduction in drain current, which is undesirable. Another method is to implant the drain separately from the source and use different implant doses. This produces an asymmetric device, which is a known device structure, but asymmetric devices require additional mask and process steps. In addition, the source and drain parasitics in asymmetric devices are different, which makes modeling of device designs more complicated.

Figure 3:
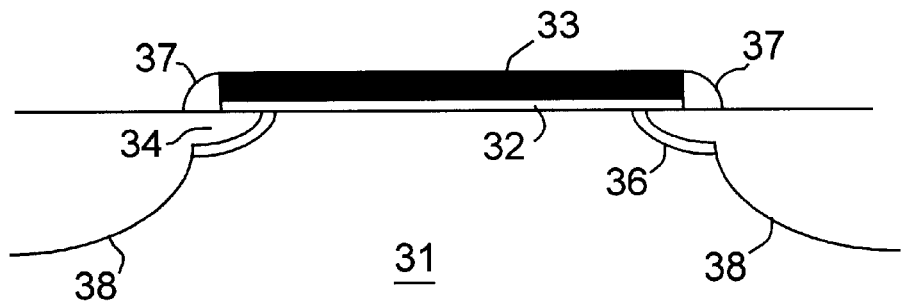
FIG. 3 is a schematic diagram of the double implant for controlling drain depletion width.

According to the invention, the source and drain are both double implanted to form the lightly doped drain (LDD). A standard LDD implant is performed using the standard process, and a second implant is made on top of the standard LDD implant. The second implant has a conductivity type opposite to that of the standard LDD. In an n-channel MOSFET, arsenic or phosphorus is used to implant the source and drain, and to implant the LDD. According to the invention, a boron implant step is added before or after the LDD implant. The resulting structure is shown in FIG. 3 (where only the gate region of an n-channel MOSFET is shown). The silicon substrate 31 is covered with gate dielectric 32 and silicon gate 33. The standard LDD implant is shown at 34, and the depletion width control implant at 36. Sidewall spacers are shown at 37, and source/drain implant at 38.

A process sequence useful for producing the double implanted structure will be described in conjunction with FIGS. 4–12.

Figure 4:
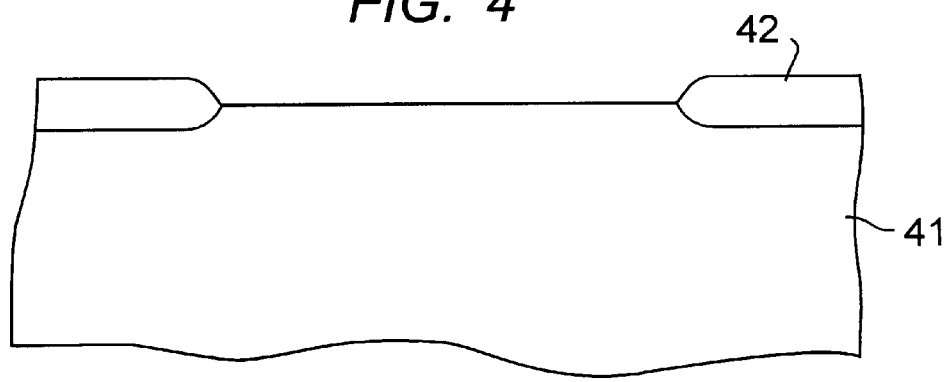
FIGS. 4–12 are schematic representations of processing steps used to fabricate the double implanted structure of FIG. 3.
Figure 5:
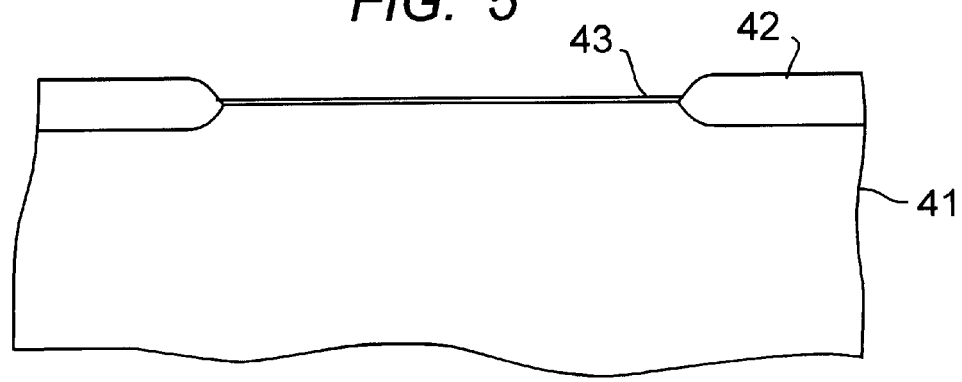
Figure 6:
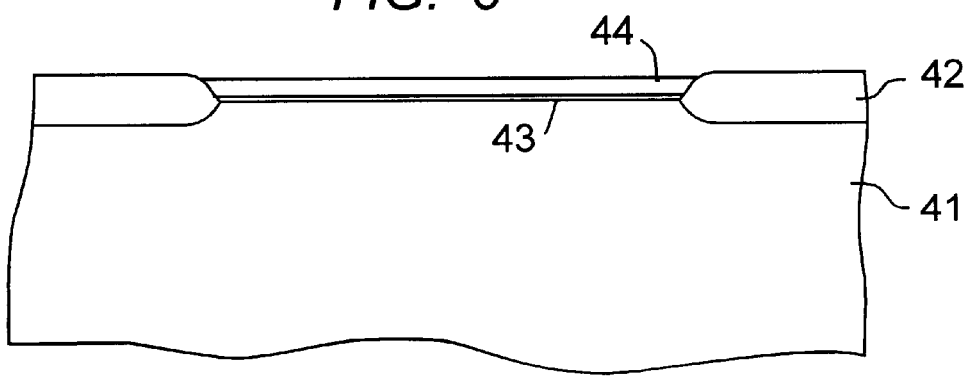
Figure 7:
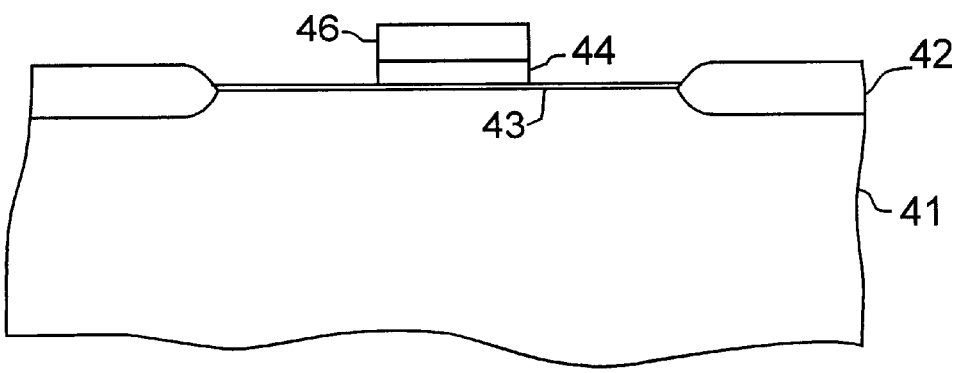

Referring to FIG. 4, p-type substrate 41 is shown with field oxide 42. The substrate is shown cut away to indicate that it is a portion of a much larger substrate. It will be understood that the drawings are not to scale and some features and layer thicknesses are exaggerated for purposes of illustration. The device illustrated is a CMOS IC but for simplicity only the P-tub is shown. The CMOS tubs are typically self-aligned, with the N-tub formed with a deep phosphorus implant, and an arsenic implant which serves as a channel-stop for the PMOS devices. The P-tub is formed using a boron implant and drive. Since boron diffuses more rapidly than the phosphorus the N-tub is at least partially driven before boron implant. After tub diffusion a second boron implant is made for punch-through suppression. The field oxide 42 is typically formed by a version of LOCOS, and for a 3.3 volt IC design typically has a thickness of 1000–5000 Å. The channel threshold voltage is then set with an implant into selected regions of silicon substrate 41, or through a thin sacrificial oxide (not shown). The gate oxide 43 is grown as shown in FIG. 5. Gate oxide thickness is typically in the range of 10–100 Å, depending on the technology used. With reference to FIG. 6, polysilicon gate layer 44 is then deposited. Typically this is deposited by chemical vapor deposition (CVD) or plasma-enhanced CVD (PE-CVD), and is heavily doped n-type for an n-channel transistor. The gate layer thickness may be in the range 1500–5000 Å. The gate layer 44 is patterned using a lithographic mask 46 as shown in FIG. 7. The mask by be standard photoresist, but is preferably an oxide hard mask formed by TEOS deposition and standard photoresist patterning. When reference is made herein to photoresist or to lithography it will be understood to include e-beam or x-ray lithography as well as conventional UV lithography. An anti-reflection coating may be applied to the surface of the oxide hardmask to improve edge acuity in defining the gate structures. The use of the oxide hardmask also adds flexibility to the process, since the oxide hard mask can, if desired, be left in place to preserve the gate characteristics during several subsequent processing steps.

Figure 8:
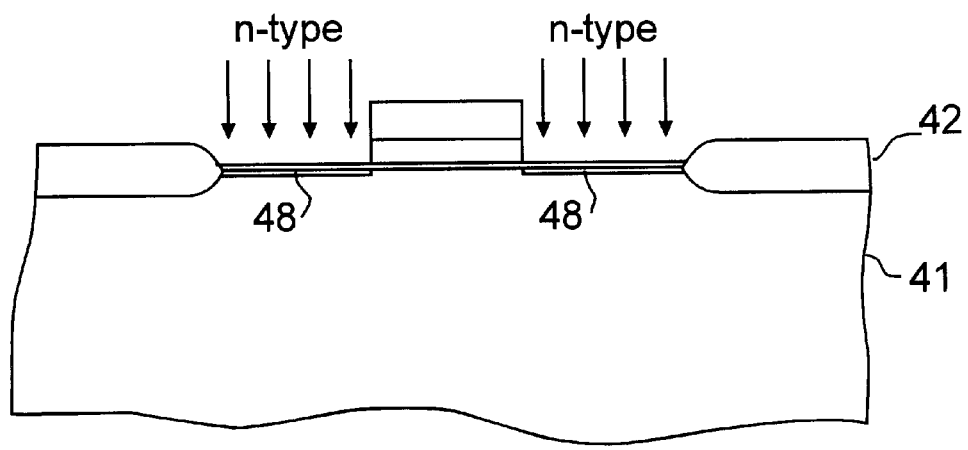
Figure 9:
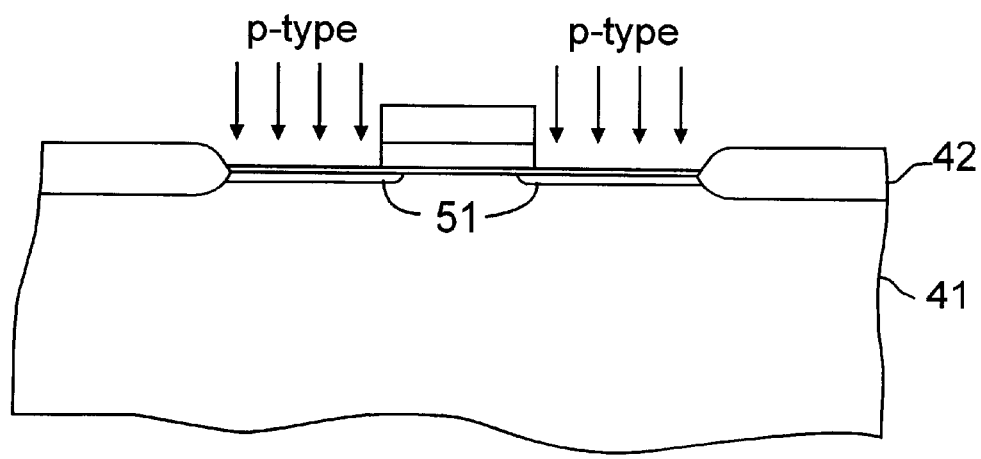
Figure 10:
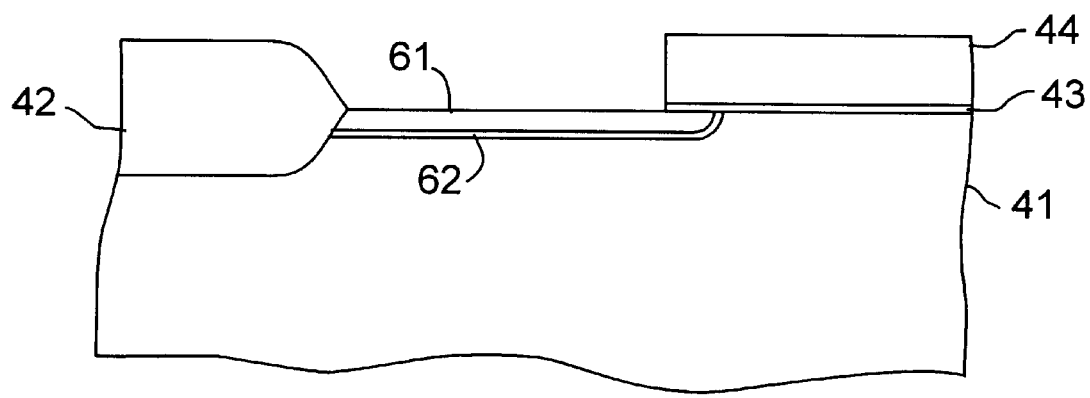

With reference to FIG. 8, the lightly doped drain (LDD) implant 48 is then performed by implanting an n-type dopant such as arsenic or phosphorus into the source/drain windows. Suitable implant conditions are 5e13–5e14/cm$^2$ and 10–100 keV. This implant is followed, or alternatively preceded, by the depletion control implant of the invention. As illustrated in FIG. 9, the depletion control implant for an n-channel device is p-type, i.e. boron, with dose and energy in the ranges 1e13–1e14/cm$^2$, and 10–50 keV respectively. The implants are then driven at 850° C. for 30 minutes to produce the result shown in FIG. 9. The diffused LDD and depletion control implant is shown at 51.

The next steps in the process will illustrate the left hand portion of the P-tub in greater detail. The structure of FIG. 9 is shown in detail in FIG. 10, where the standard arsenic or phosphorus LDD appears at 61, and the boron depletion control implant at 62. These two implants are conveniently driven simultaneously, relying on the faster diffusing properties of boron to produce an LDD surrounded by the boron depletion control implant.

Figure 11:
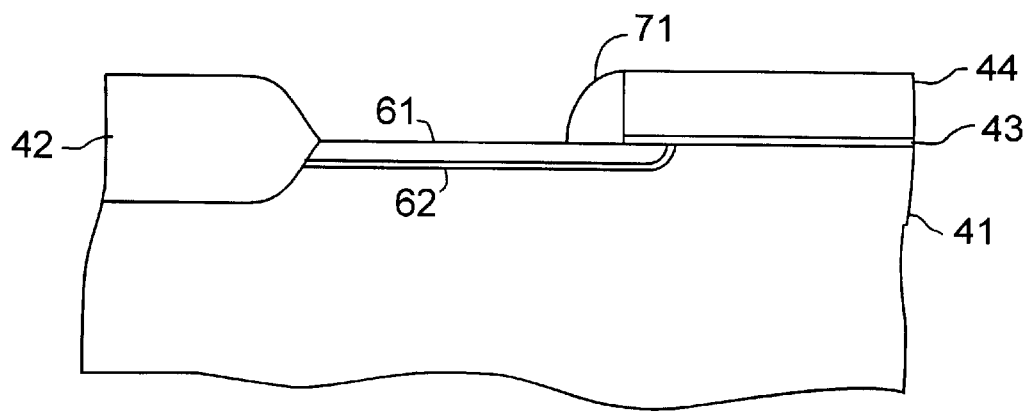
Figure 12:
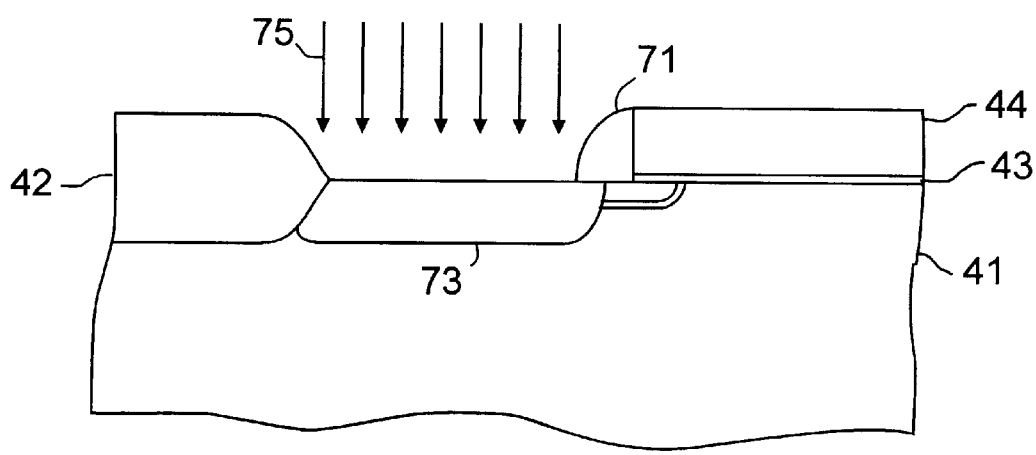

With reference to FIG. 11, the sidewall spacer 71 is shown on the edge of gate electrode 44. The sidewall spacer is formed using conventional techniques such as depositing TEOS, masking and etching. The drain implant 73 is then performed as shown in FIG. 12 by a heavy implant of arsenic or phosphorus, represented by arrows 75, into the window defined by the field oxide 42 and the sidewall spacer 71. Interconnections for the device are made by standard deposition of interlevel dielectric, and metal interconnect levels. These interconnections comprise contacts to the gate, source and drain and enable analog signals to be applied to the gate, and analog output to be detected at the source/drain. The processing for these contacts and interconnections is conventional and, in the interest of simplicity, need not be illustrated or described in detail.

Those skilled in the art will appreciate that in the process just described, the only essential variation from the standard LDD is an additional implant step. No mask changes or additions are required.

To demonstrate the effect of the depletion control implant (DCI), PADRE simulations were made for devices with and without DCI. The technology used in this illustration is a 0.25 µm CMOS technology, with 0.25 µm as the minimum design rule for the gate length. A comparison of typical devices is given in the following table. The nominal channel dimensions are L=0.25 µm, W=15 µm. The LDD implant was 2e$^{14}$/cm$^{-2}$ arsenic at 80 keV, and the depletion control implant was 2e13/cm$^2$ boron at 20 keV.

TABLE I

| PARAMETER | NO DCI | WITH DCI |
|---|---|---|
| $V_{TH}$ (V) | 0.51 | 0.53 |
| Subt.slope (mV/dec) | 79.6 | 80.8 |
| $I_{off}$ (A) | 1.5e – 11 | 6.1e – 12 |
| $I_{on}$ (A) | 6.38 | 6.0 |

Table I shows that the DCI has no adverse effects on the minimum design rule device. In particular, $V_T$ is changed by only 20 mV.

AC analysis was then used in PADRE simulations to obtain the admittance values $Y_{ij}$, at 1 MHz frequency for typical bias levels. Bias voltages were chosen such that $V_{ds} > V_{gs} - V_T$ to assure that the transistor remains in saturation. Results show that $r_{out}$ increases by approximately 40% over all bias levels as a result of the depletion control implant (DCI) of the invention.

Gain ($g_m r_{out}$) for devices with DCI improves from 19% at low bias voltages to 40% at high bias levels, compared to devices with no DCI. It is well known that gain is inversely proportional to bias current. Gain in a device with DCI is less dependent on current than a device without DCI.

The DCI will result in an increase of the output impedance ($r_{out}$) for long channel devices, e.g. ones with twice the minimum design rule, since for all channel lengths, it acts to reduce the depletion width at the drain junction.

Other plant combinations that give effective results are given in the following table.

TABLE II

| EXAMPLE | LDD IMPLANT | DCI |
|---|---|---|
| 1 | As 80 keV, 2e14 | B 20 keV, 2e13 |
| 2 | As 80 keV, 2e14 | B 50 keV, 2e13 |
| 3 | As 40 kev, 2e14 | B 10 keV, 2e13 |
| 4 | P 50 keV, 2e14 | B 40 keV, 2e13 |
| 5 | P 10 keV, 2e14 | B 40 keV, 2e13 |
| 6 | P 50 keV, 5e13 | B 40 keV, 1e13 |
| 7 | P 50 keV, 5e14 | B 40 keV, 1e14 |

The table above shows that a variety of implant conditions, within the limits prescribed, can be used for the depletion control implant. In general, it is regarded as a useful improvement if the depletion control implant produces an output impedance increase for the transistor of at least 20%.

For purposes of defining analog IC devices, and distinguishing these devices from digital IC devices, analog circuits operate with input voltages and output voltages that vary over a range of e.g. greater than 0.3 V, and typically greater than 0.5 V. The invention described here is useful in IC chips that are fully analog, and also in IC chips that are mixed signal, i.e. analog/digital.

In mixed signal ICs the transistors that perform digital functions may be designed with a double LDD implant. The purpose of this implant is to avoid adverse short channel effects and maintain the threshold voltage at or above the design value. Therefore the effect of the double implanted LDD in digital technology is to increase the $V_T$ of short channel devices (gate lengths comparable to, or less than twice, the design rule) by a significant value, typically at least 100 mV. The double implanted LDD for analog circuits, according to this invention, is designed to minimize changes in $V_T$. It is preferred that the depletion control implant of the invention change $V_T$ by typically less than 50 mV.

When used as load devices in mixed signal ICs, analog transistors are typically relatively large, i.e. have channel lengths greater than 0.7 μm. As indicated above, the double implanted LDD used in digital technology has no recognized value applied to devices this large. However, according to this invention, the output impedance of these devices is improved substantially using the depletion control implant of the invention.

The typical LDD extends beneath the gate to ensure that the transistor will turn on properly. The depletion control implant region, made in the same window as the LDD implant, extends laterally beneath the gate to a distance slightly greater than the LDD region. This is easily achieved using the fast diffusing properties of boron. In a p-channel device, where the LDD implant is typically boron, the depletion control implant (As or P) can be performed first, and driven at least partially, before the boron LDD implant is performed. While this description, and in some cases the appended claims, focuses on n-channel devices, it will be understood that these usually constitute only part of the IC transistor array.

Reference made herein to silicon gate, polysilicon gate, etc. are intended to refer to silicon gates of polycrystalline silicon or amorphous silicon.

Various additional modifications of this invention will occur to those skilled in the art. All deviations from the specific teachings of this specification that basically rely on the principles and their equivalents through which the art has been advanced are properly considered within the scope of the invention as described and claimed.

We claim:

1. An improved silicon MOS transistor integrated circuit comprising a plurality of digital MOS transistor devices and a plurality of analog MOS transistor devices, each of said MOS transistor devices having an MOS gate with a gate threshold voltage $V_t$ and an MOS channel beneath the MOS gate, said digital MOS transistor devices having a channel length equal to L, and said analog MOS transistor devices having a channel length greater than L, each of said analog MOS transistors having:

(a) a silicon substrate, said silicon substrate having a first conductivity type,
   (b) a gate dielectric on said silicon substrate,
   (c) a polysilicon gate on said gate dielectric,
   (d) a lightly doped drain (LDD) region in said silicon substrate, said LDD region extending beneath said polysilicon gate by distance x,
   (e) a depletion control implant region of said first conductivity type in said silicon substrate, said depletion control implant region extending beneath said polysilicon gate by distance y, where y>x and having an impurity level that changes the gate threshold voltage $V_t$ by less than 50 mV,
   (f) sidewall spacers on said silicon gate,
   (g) source and drain regions in said silicon substrate,
   (h) electrical contacts to said gate source and drain, and
   (i) means for applying an analog signal to said silicon gate.

2. The MOS transistor integrated circuit of claim 1 wherein the silicon substrate is p-type.

3. The MOS transistor integrated circuit of claim 2 wherein the depletion control implant is boron with a dose in the range 1E13–1E14/cm².

4. The MOS transistor integrated circuit of claim 3 wherein the LDD implant is arsenic with a dose in the range 5E13–5E14/cm².

5. The MOS transistor integrated circuit of claim 3 wherein the LDD implant is phosphorus with a dose in the range 5E13–5E14/cm².

6. The MOS transistor integrated circuit of claim 1 wherein the channel length of the analog transistors is greater than 0.7 μm.

* * * * *